(12) United States Patent
Toprac (10) Patent No.: US 6,368,879 B1
(45) Date of Patent: Apr. 9, 2002

(54) PROCESS CONTROL WITH CONTROL SIGNAL DERIVED FROM METROLOGY OF A REPETITIVE CRITICAL DIMENSION FEATURE OF A TEST STRUCTURE ON THE WORK PIECE

(75) Inventor: Anthony J. Toprac, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/401,090

(22) Filed: Sep. 22, 1999

(51) Int. Cl.[7] ............................................. H01L 21/00
(52) U.S. Cl. ............................................. 438/5; 438/5
(58) Field of Search ............................. 438/14, 5, 7, 8, 438/9, 16

(56) References Cited

U.S. PATENT DOCUMENTS

| 5,655,110 A | * | 8/1997 | Krivokapic et al. |
| 5,701,013 A | * | 12/1997 | Hsia et al. |
| 5,913,102 A | | 6/1999 | Yang ........................... 438/14 |
| 5,926,690 A | * | 7/1999 | Toprac et al. |
| 6,130,750 A | * | 10/2000 | Ausschnitt et al. |
| 6,225,639 B1 | * | 5/2001 | Adams et al. |

FOREIGN PATENT DOCUMENTS

GB 2 328 761 A * 3/1999

* cited by examiner

Primary Examiner—Charles Bowers
Assistant Examiner—Evan Pert
(74) Attorney, Agent, or Firm—Williams, Morgan & Amerson, P.C.

(57) ABSTRACT

A method is provided for manufacturing, the method including processing a workpiece in a processing step, measuring a critical dimension of features formed on the workpiece using a test structure formed on the workpiece, the test structure including a plurality of the features, and forming an output signal corresponding to the critical dimension measurements. The method also includes feeding back a control signal based on the output signal to adjust the processing performed in the processing step if the output signal corresponding to the critical dimension measurements indicates a predetermined tolerance value has been exceeded.

20 Claims, 7 Drawing Sheets

PROCESS CONTROL WITH CONTROL SIGNAL DERIVED FROM METROLOGY OF A REPETITIVE CRITICAL DIMENSION FEATURE OF A TEST STRUCTURE ON THE WORK PIECE

BACKGROUND OF THE INVENTION

1. Field of the Invention

This invention relates generally to semiconductor fabrication technology, and, more particularly, to a method for semiconductor metrology.

2. Description of the Related Art

There is a constant drive within the semiconductor industry to increase the quality, reliability and throughput of integrated circuit devices, e.g., microprocessors, memory devices, and the like. This drive is fueled by consumer demands for higher quality computers and electronic devices that operate more reliably. These demands have resulted in a continual improvement in the manufacture of semiconductor devices, e.g., transistors, as well as in the manufacture of integrated circuit devices incorporating such transistors. Additionally, reducing the defects in the manufacture of the components of a typical transistor also lowers the overall cost per transistor as well as the cost of integrated circuit devices incorporating such transistors.

The technologies underlying semiconductor processing tools have attracted increased attention over the last several years, resulting in substantial refinements. However, despite the advances made in this area, many of the processing tools that are currently commercially available suffer certain deficiencies. In particular, such tools often lack advanced process data monitoring capabilities, such as the ability to provide historical parametric data in a user-friendly format, as well as event logging, real-time graphical display of both current processing parameters and the processing parameters of the entire run, and remote, i.e., local site and worldwide, monitoring. These deficiencies can engender nonoptimal control of critical processing parameters, such as throughput accuracy, stability and repeatability, processing temperatures, mechanical tool parameters, and the like. This variability manifests itself as within-run disparities, run-to-run disparities and tool-to-tool disparities that can propagate into deviations in product quality and performance, whereas an ideal monitoring and diagnostics system for such tools would provide a means of monitoring this variability, as well as providing means for optimizing control of critical parameters.

Among the parameters it would be useful to monitor and control are critical dimensions (CDs), which are the smallest feature sizes that particular processing devices may be capable of producing. For example, the minimum widths w of polycrystalline (polysilicon or poly) gate lines for metal oxide semiconductor field effect transistors (MOSFETs or MOS transistors) may correspond to one CD for a semiconductor device having such transistors. Similarly, the pitch p (distance between centers of parallel gate lines, for example) may be another CD for a semiconductor device having such transistors arranged in a dense array.

However, measurement noise limits the ability to control precisely CDs in semiconductor and microelectronic device manufacturing. Typically, to obtain a good estimate of a CD in the presence of such measurement noise, multiple measurements of poly gate lines of many different MOS transistors, for example, must be made and a suitable average and/or median of these multiple measurements may then be used to estimate the "true value" of the CD. However, measuring the poly gate lines of many different MOS transistors is time consuming and costly in terms of metrology tool utilization. For example, a conventional implementation of multiple measurement metrology using an on-line scanning electron microscope (SEM) takes measurements of a representative type of line at many different sites on a die and/or wafer, each site requiring a time-consuming separate alignment and/or stage travel of the SEM.

The present invention is directed to overcoming, or at least reducing the effects of, one or more of the problems set forth above.

SUMMARY OF THE INVENTION

In one aspect of the present invention, a method is provided for manufacturing, the method including processing a workpiece in a processing step, measuring a critical dimension of features formed on the workpiece using a test structure formed on the workpiece, the test structure including a plurality of the features, and forming an output signal corresponding to the critical dimension measurements. The method also includes feeding back a control signal based on the output signal to adjust the processing performed in the processing step if the output signal corresponding to the critical dimension measurements indicates a predetermined tolerance value has been exceeded.

BRIEF DESCRIPTION OF THE DRAWINGS

The invention may be understood by reference to the following description taken in conjunction with the accompanying drawings, in which the leftmost significant digit(s) in the reference numerals denote(s) the first figure in which the respective reference numerals appear, and in which:

FIGS. 1–11 illustrate schematically various embodiments of a method for manufacturing according to the present invention; and, more particularly:

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 1:
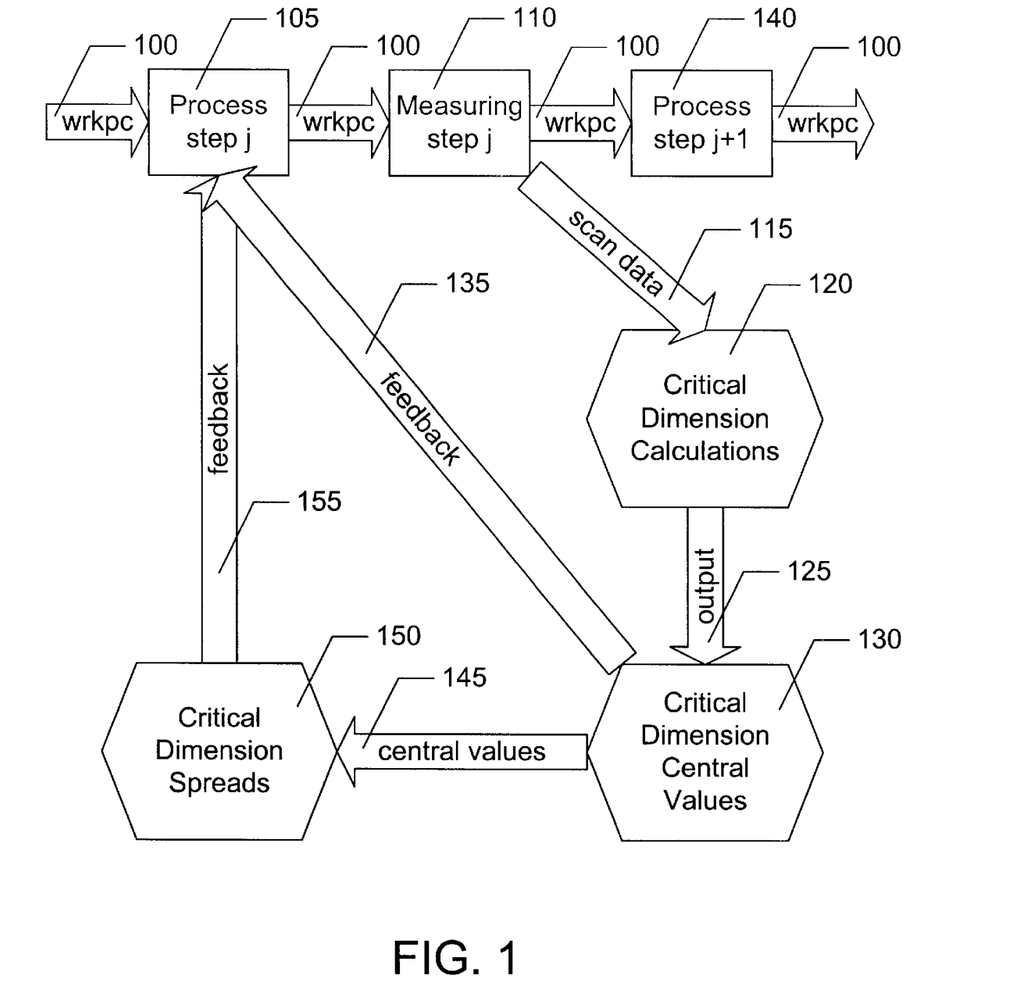
FIG. 1 illustrates schematically a flow chart for various embodiments of a method for manufacturing according to the present invention.

Illustrative embodiments of a method for manufacturing according to the present invention are shown in FIGS. 1–11. As shown in FIG. 1, a workpiece 100, such as a semiconducting substrate or wafer, for example, is delivered to a processing step j 105, where j may have any value from j=1 to j=N. The total number N of processing steps, such as masking, etching, depositing material and the like, used to form the finished workpiece 100, may range from N=1 to about any finite value.

Figure 2:
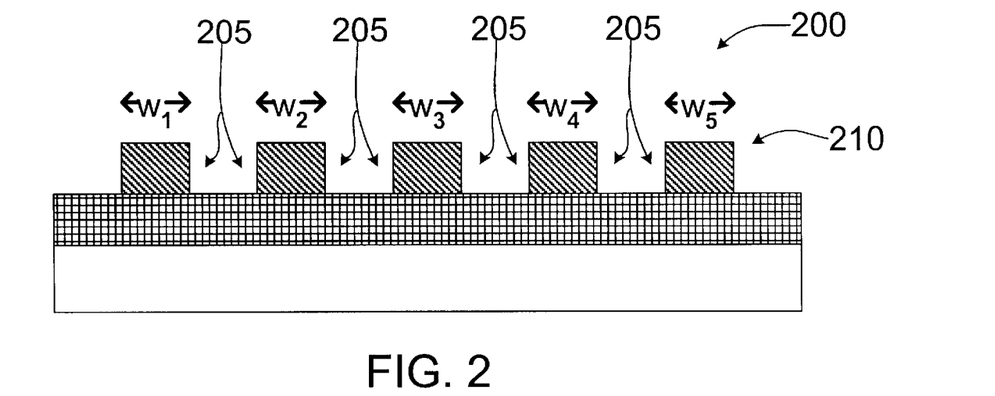
FIGS. 2–4 illustrate schematically various embodiments of a test structure used in various embodiments of a method for manufacturing according to the present invention.

As shown in FIG. 1, the workpiece 100 is sent from the processing step j 105 and delivered to a measuring step j 110. In the measuring step j 110, the workpiece 100 is measured by having a metrology or measuring tool (not shown) measure a critical dimension (CD) of at least two features formed on the workpiece 100. As described above, a CD is the smallest feature size that a particular processing device may be capable of producing. For example, the minimum widths w of polycrystalline (polysilicon or poly) gate lines for metal oxide semiconductor field effect transistors (MOSFETs or MOS transistors) may correspond to one CD for a semiconductor device having such transistors. Similarly, the pitch p (distance between parallel lines, for example) may be another CD for a semiconductor device having MOS transistors arranged in a dense array. As shown in FIG. 2, the measurement of the CD of features formed on the workpiece 100 performed in the measuring step j 110 may be effected using a test structure 200 having a plurality of representative features 205.

Figure 3:
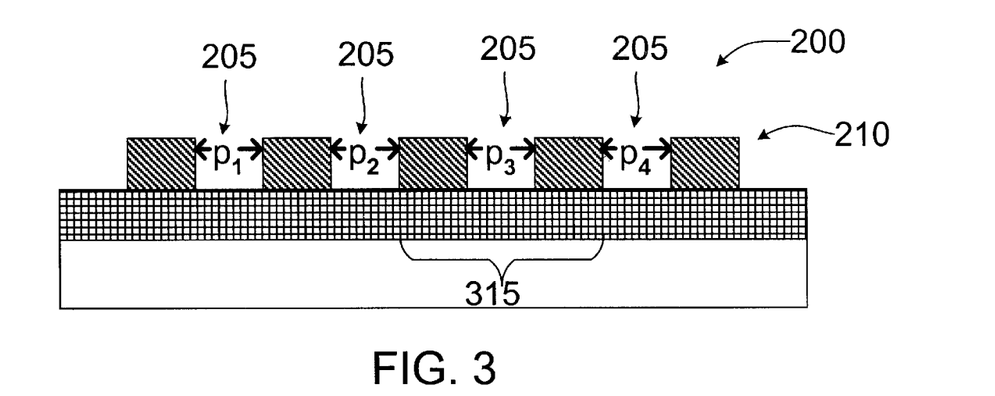
Figure 4:
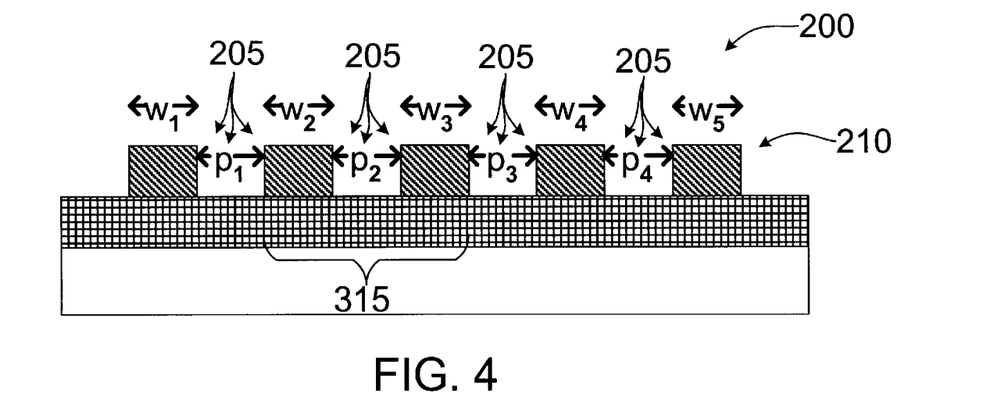

In one illustrative embodiment, as shown in FIG. 2, the plurality of representative features 205 may be a plurality of poly gate lines 210, each of the poly gate lines 210 formed to have the line width w of a gate line of an MOS transistor. In another illustrative embodiment, as shown in FIG. 3, the plurality of representative features 205 may be a plurality of spacings between adjacent pairs 315 of the poly gate lines 210, each of the adjacent pairs 315 of the poly gate lines 210 formed to have the pitch p between adjacent lines of an MOS transistor array. In yet another illustrative embodiment, as shown in FIG. 4, the plurality of representative features 205 may be the plurality of poly gate lines 210, each of the poly gate lines 210 formed to have the line width w of a gate line of an MOS transistor, and the plurality of spacings between adjacent pairs 315 of the poly gate lines 210, each of the adjacent pairs 315 of the poly gate lines 210 formed to have the pitch p between adjacent lines of an MOS transistor array.

Figure 5:
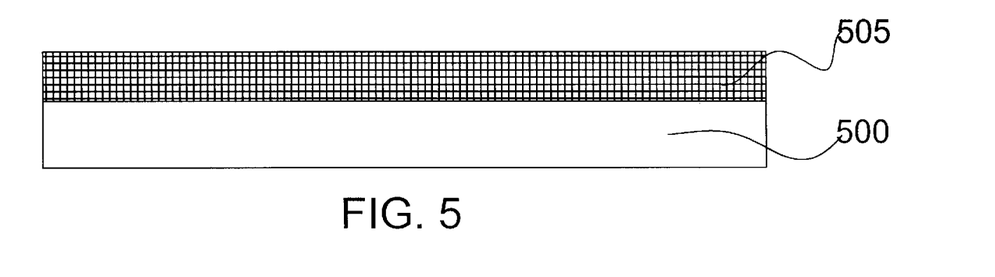
FIGS. 5–7 illustrate schematically various embodiments of a method for making a test structure used in various embodiments of a method for manufacturing according to the present invention.
Figure 6:
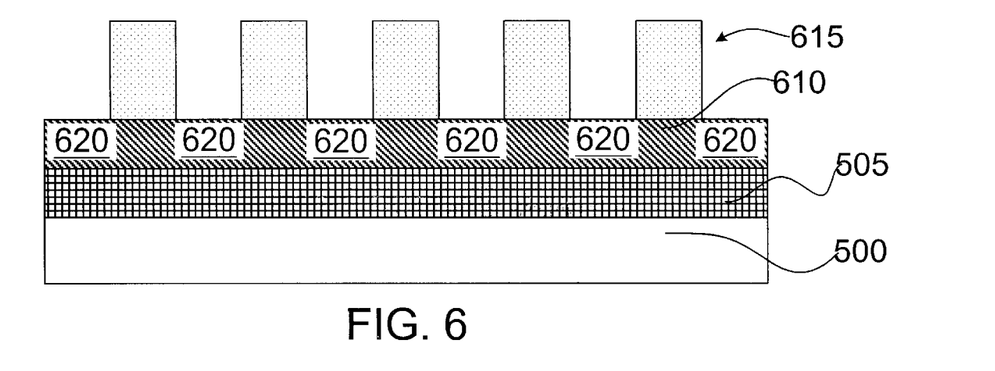
Figure 7:
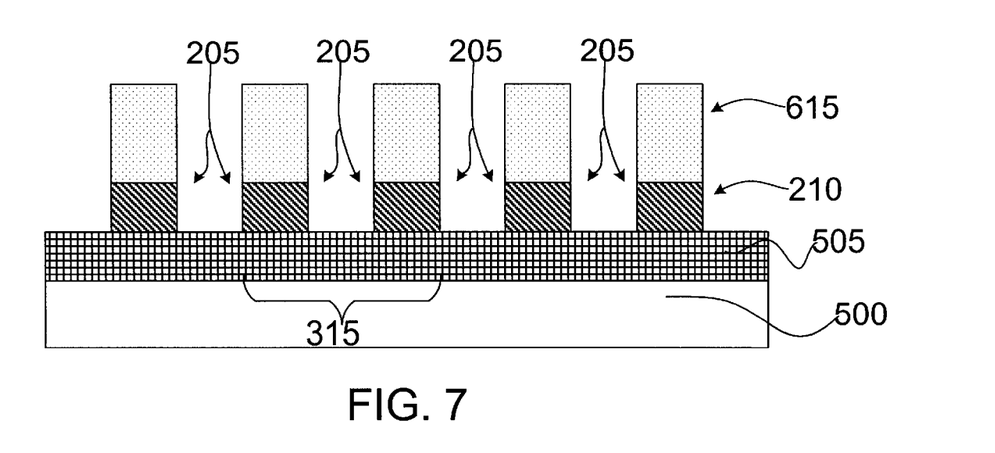

FIGS. 5–7 illustrate a method of forming a test structure 200 according to the present invention. As shown in FIG. 5, a dielectric layer 505 may be formed above a structure 500, such as a semiconducting substrate (e.g., a silicon wafer). The dielectric layer 505 may be formed by a variety of known techniques for forming such layers, e.g., chemical vapor deposition (CVD), low-pressure CVD (LPCVD), plasma-enhanced CVD (PECVD), sputtering and physical vapor deposition (PVD), and the like, and may have a thickness ranging from approximately 100–2000 Å, for example. The dielectric layer 505 may be formed from a variety of dielectric materials and may, for example, be an oxide (e.g., Ge oxide), a nitride (e.g., GaAs nitride), an oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon nitride ($Si_3N_4$), silicon oxynitride ($Si_xO_yN_z$), and the like. In one illustrative embodiment, the dielectric layer 505 is comprised of a silicon dioxide ($SiO_2$) having a thickness of approximately 500 Å, which is formed by an LPCVD process for higher throughput.

As shown in FIG. 6, a poly layer 610 may be formed above the dielectric layer 505. The poly layer 610 may be formed by a variety of known techniques for forming such layers, e.g., CVD, LPCVD, PECVD, PVD, and the like, and may have a thickness ranging from approximately 500–5000 Å. In one illustrative embodiment, the poly layer 610 has a thickness of approximately 2000 Å and is formed by an LPCVD process for higher throughput.

As shown in FIG. 6, a mask 615 of photoresist, for example, may be formed and patterned above the poly layer 610, exposing portions 620 of the poly layer 610. The hotoresist mask 615 may have a thickness ranging from approximately 10000–15000 Å (10 kÅ–15 kÅ), for example. As shown in FIGS. 6–7, the portions 620 of the poly layer 610 may be removed, by being etched away, for example, using the photoresist mask 615, forming the features 205 (see FIG. 2).

As shown in FIGS. 6–7, the features 205 may be formed using a variety of known photolithography and etching techniques, such as an anisotropic etching process using hydrogen bromide (HBr) and argon (Ar) as the etchant gases, for example. The features 205 may be formed to have widths w and pitches p that correspond to the CDs that are to be measured in the measuring step j 110.

As shown in FIGS. 1–2, in the measuring step j 110, the test structure 200 on the workpiece 100 may be measured by having the metrology or measuring tool (not shown) measure the CD of at least two of the representative features 205, producing scan data 115 indicative of the CD measurements. In one illustrative embodiment, a scanning electron microscope (SEM) is used to perform the CD measurements of the poly gate lines 210 formed to have line width w, producing sample line width values $w_1, w_2, \ldots, w_m$, where m is the total number of the poly gate lines 210 of the test structure 200 that are measured by the SEM (e.g., m=5 in FIG. 2).

In another illustrative embodiment, an SEM is used to perform the CD measurements of the spacings between adjacent pairs 315 of the poly gate lines 210 formed to have pitch p, producing sample pitch values $p_1, p_2, \ldots, p_{m-1}$, where m−1 is the total number of the spacings between the m poly gate lines 210 of the test structure 200 that are measured by the SEM (e.g., m=5 in FIG. 3). In yet another illustrative embodiment, an SEM is used to perform the CD measurements of the poly gate lines 210 formed to have line width w, producing sample line width values $w_1, w_2, \ldots, w_m$, where m is the total number of the poly gate lines 210 of the test structure 200, and the SEM is also used to perform the CD measurements of the spacings between adjacent pairs 315 of the poly gate lines 210 formed to have pitch p, producing sample pitch values $p_1, p_2, \ldots, p_{m-1}$, where m−1 is the total number of the spacings between the m poly gate lines 210 of the test structure 200 that are measured by the SEM (e.g., m=5 in FIG. 4).

As shown in FIG. 1, the scan data 115 is sent from the measuring step j 110 and delivered to a CD calculation step 120. In the CD calculation step 120, the CDs corresponding to the CD measurements performed in the measuring step j 110 may be calculated, for example, by having the respective central values and spreads around the central values of the CD measurements calculated, producing an output signal 125.

Figure 8:
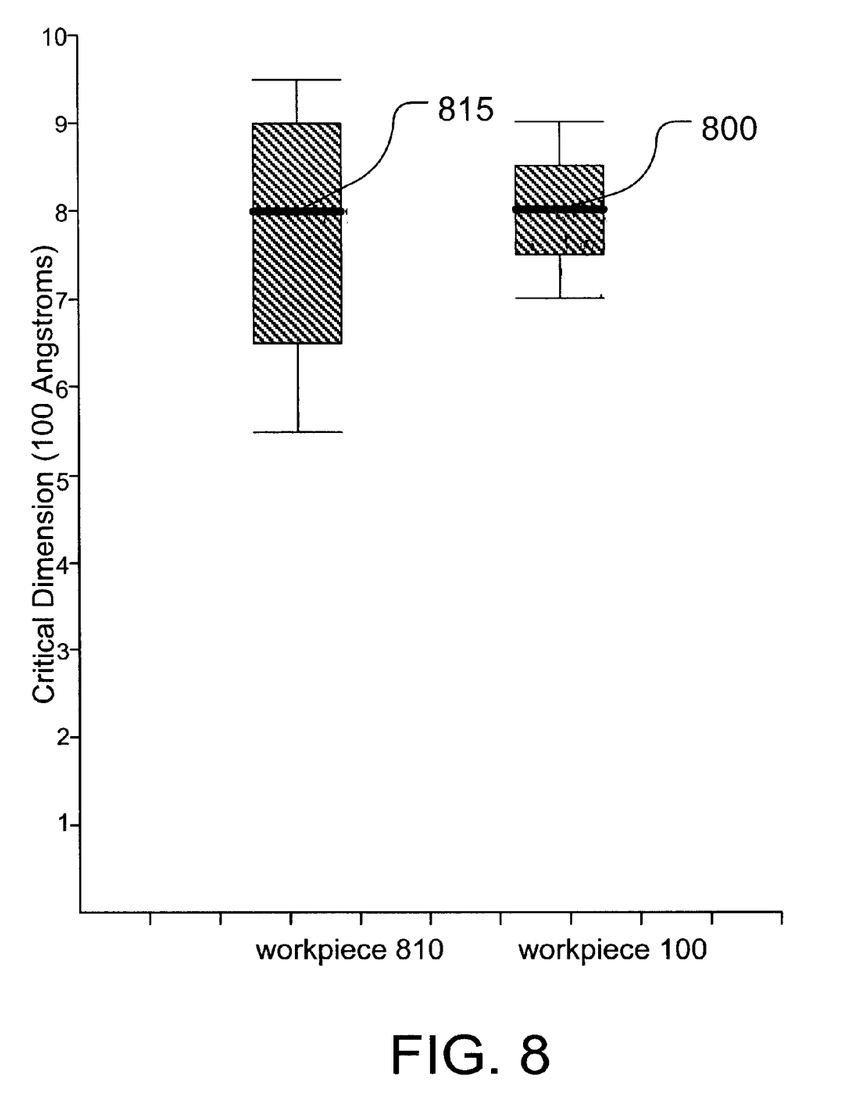
FIGS. 8–11 illustrate schematically various embodiments of displays of central values and spreads around the central values of CD measurements used in various embodiments of a method for manufacturing according to the present invention.

As shown in FIG. 1, the output signal 125 is sent from the CD calculation step 120 and delivered to a CD central value display step 130. In the CD central value display step 130, central values 145 of the CD measurements in the output signal 125 may be displayed. For example, as shown in FIG. 8, using a Tukey "box and whiskers" plot, the CD measurements performed on the features 205 of the test structure 200 (see FIG. 2) on the workpiece 100 may have a median value 800 of approximately 800 Å. The median value 800 of the CD measurements is the sample value at the midpoint of the CD measurements, so that half of the CD measurement values are less than or equal to the median value 800 and half of the CD measurement values are greater than or equal to the median value 800.

As shown in FIG. 8, Tukey box and whiskers plots may be used to compare the CD measurement values taken using the test structure 200 formed on the workpiece 100 with CD measurement values taken using a test structure 805 (not shown) formed on a workpiece 810 (not shown), similar to the test structure 200 formed on the workpiece 100, for example. The median value 815 is approximately 800 Å for the CD measurements of features 820 (not shown) of the test structure 805 formed on the workpiece 810, similar to the features 205 of the test structure 200.

Figure 9:
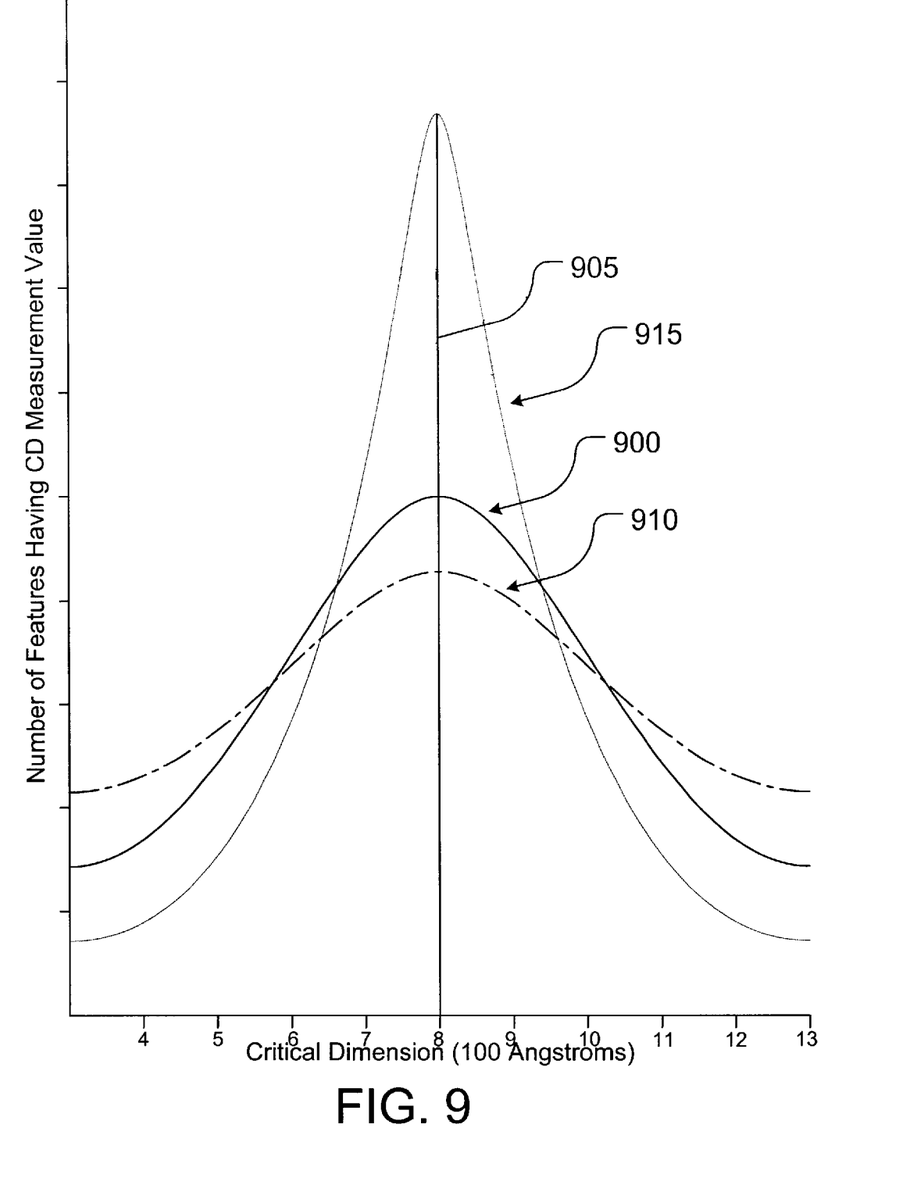

Alternatively, as shown in FIG. 9, using a Student's t-distribution plot 900, the CD measurements performed on the features 205 of the test structure 200 (see FIG. 2) of the workpiece 100 may have a sample mean value 905 of approximately 800 Å. The sample mean value 905 of the CD measurements taken using the test structure 200 is the sample average $$\bar{x} = \frac{1}{m} \sum_{i=1}^{m} x_i$$

of the CD measurements over all m of the features 205 that are measured on the test structure 200, where $x_i$ is the CD measurement of the ith feature 205. Note that the number m of the features 205 that are measured on the test structure 200 may be less than or equal to the total number M of the features 205 on the test structure 200.

As shown in FIG. 9, Student's t-distribution plots 900 and 910 may be used to compare the sample mean value 905 of the CD measurements (taken using the test structure 200 formed on the workpiece 100) with the sample mean value 905 of the CD measurements taken using the test structure 805 (not shown) formed on the workpiece 810 (not shown), for example. The sample mean value 905 of approximately 800 Å of the CD measurements taken using the test structure 805 is the sample average $$\bar{y} = \frac{1}{n} \sum_{j=1}^{n} y_j$$

of the CD measurements over all n of the features 820 (not shown) that are measured on the test structure 805, where $y_j$ is the CD measurement of the jth feature 820. Note that the number n of the features 820 that are measured on the test structure 805 may be less than or equal to the total number T of the features 820 on the test structure 805.

As shown in FIG. 9, the Student's t-distribution plots 900 and 910 may approach the Gaussian normal z-distribution plot 915 as the number of features n and m becomes very large, for m>n>> about 25. The Gaussian normal z-distribution plot 915 has the mean value 905 ($\mu$) given by the expressions $$\mu = \left\langle \frac{1}{m} \sum_{i=1}^{m} x_i \right\rangle = \frac{1}{m} \sum_{i=1}^{m} \langle x_i \rangle = \frac{1}{m} \sum_{i=1}^{m} \mu = \frac{m}{m} \mu$$

and $$\mu = \left\langle \frac{1}{n} \sum_{j=1}^{n} y_j \right\rangle = \frac{1}{n} \sum_{j=1}^{n} \langle y_j \rangle = \frac{1}{n} \sum_{j=1}^{n} \mu = \frac{n}{n} \mu,$$

in the limit m>n>> about 25, where $x_i$ (the CD measurement of the ith feature 205) and $y_j$ (the CD measurement of the jth feature 820) are treated as independent random variables with means $\langle x_i \rangle = \mu = \langle y_j \rangle$ for $1 \leq i \leq m$ and $1 \leq j \leq n$, and where the mean value 905 ($\mu$) may also be approximately 800 Å.

The display of the central values 145 of the output signal 125 in the CD central value display step 130 may be used to alert an engineer of the need to adjust the processing performed in the processing step j 105. The engineer may also alter, for example, the type of central value 145 calculated in the CD calculation step 120, affecting the output signal 125 produced.

As shown in FIG. 1, a feedback control signal 135 may be sent from the CD central value display step 130 to the processing step j 105 to adjust the processing performed in the processing step j 105. In one illustrative embodiment, as shown in FIG. 8, the SEM (used to perform the CD measurements of the poly gate lines 210 formed to have line width w) may measure sample line width values $w_1, w_2, \ldots, w_m$, having a median value 800 of approximately 800 Å. In this illustrative embodiment, the line width w of the poly gate lines 210 should have been approximately 750 Å, with a predetermined acceptable tolerance value of approximately 25 Å. In this illustrative embodiment, the tolerance value (approximately 25 Å) is compared with the difference value (approximately 50 Å) between the desired CD value of approximately 750 Å and the median value 800 of approximately 800 Å. Consequently, the feedback control signal 135 may act to cause the processing performed in the processing step j 105 to increase the poly overetch time, since the tolerance value (approximately 25 Å) is exceeded by the difference value (approximately 50 Å).

In another illustrative embodiment, as shown in FIG. 8, the SEM (used to perform the CD measurements of the poly gate lines 210 formed to have pitch p) may measure sample pitch values $p_1, p_2, \ldots, p_n$, having a median value 800 of approximately 800 Å. In this illustrative embodiment, the pitch p between the poly lines 210 should have been approximately 750 Å, with a predetermined acceptable tolerance value of approximately 25 Å. In this illustrative embodiment, the tolerance value (approximately 25 Å) is compared with the difference value (approximately 50 Å) between the desired CD value of approximately 750 Å and the median value 800 of approximately 800 Å. Consequently, the feedback control signal 135 may act to cause the processing performed in the processing step j 105 to decrease the poly etch time, since the tolerance value (approximately 25 Å) is exceeded by the difference value (approximately 50 Å).

In yet another illustrative embodiment, as shown in FIG. 9, the SEM (used to perform the CD measurements of the poly gate lines 210 formed to have the line width w) may measure sample line width values $w_1, w_2, \ldots, w_m$, having a sample mean value 905 of approximately 800 Å. In this illustrative embodiment, the line width w of the poly gate lines 210 should have been approximately 750 Å, with a predetermined acceptable tolerance value of approximately 25 Å. In this illustrative embodiment, the tolerance value (approximately 25 Å) is compared with the difference value (approximately 50 Å) between the desired CD value of approximately 750 Å and the sample mean value 905 of approximately 800 Å. Consequently, the feedback control signal 135 may act to cause the processing performed in the processing step j 105 to increase the poly overetch time, since the tolerance value (approximately 25 Å) is exceeded by the difference value (approximately 50 Å).

In still yet another illustrative embodiment, as shown in FIG. 9, the SEM (used to perform the CD measurements of the poly gate lines 210 formed to have the pitch p) may measure sample pitch values $p_1, p_2, \ldots, p_n$, having a sample mean value 905 of approximately 800 Å. In this illustrative embodiment, the pitch p between the poly lines 210 should have been approximately 750 Å, with a predetermined acceptable tolerance value of approximately 25 Å. In this illustrative embodiment, the tolerance value (approximately 25 Å) is compared with the difference value (approximately 50 Å) between the desired CD value of approximately 750 Å and the sample mean value 905 of approximately 800 Å. Consequently, the feedback control signal 135 may act to cause the processing performed in the processing step j 105 to decrease the poly etch time, since the tolerance value (approximately 25 Å) is exceeded by the difference value (approximately 50 Å).

As shown in FIG. 1, the workpiece 100 is sent from the measuring step j 110 and delivered to a processing step j+1 140. In the processing step j+1 140, the workpiece 100 undergoes another one of the total number N of processing steps, such as masking, etching, depositing material and the like, used to form the finished workpiece 100. As shown in FIG. 1, the workpiece 100 is then sent from the processing step j+1 140.

Figure 10:
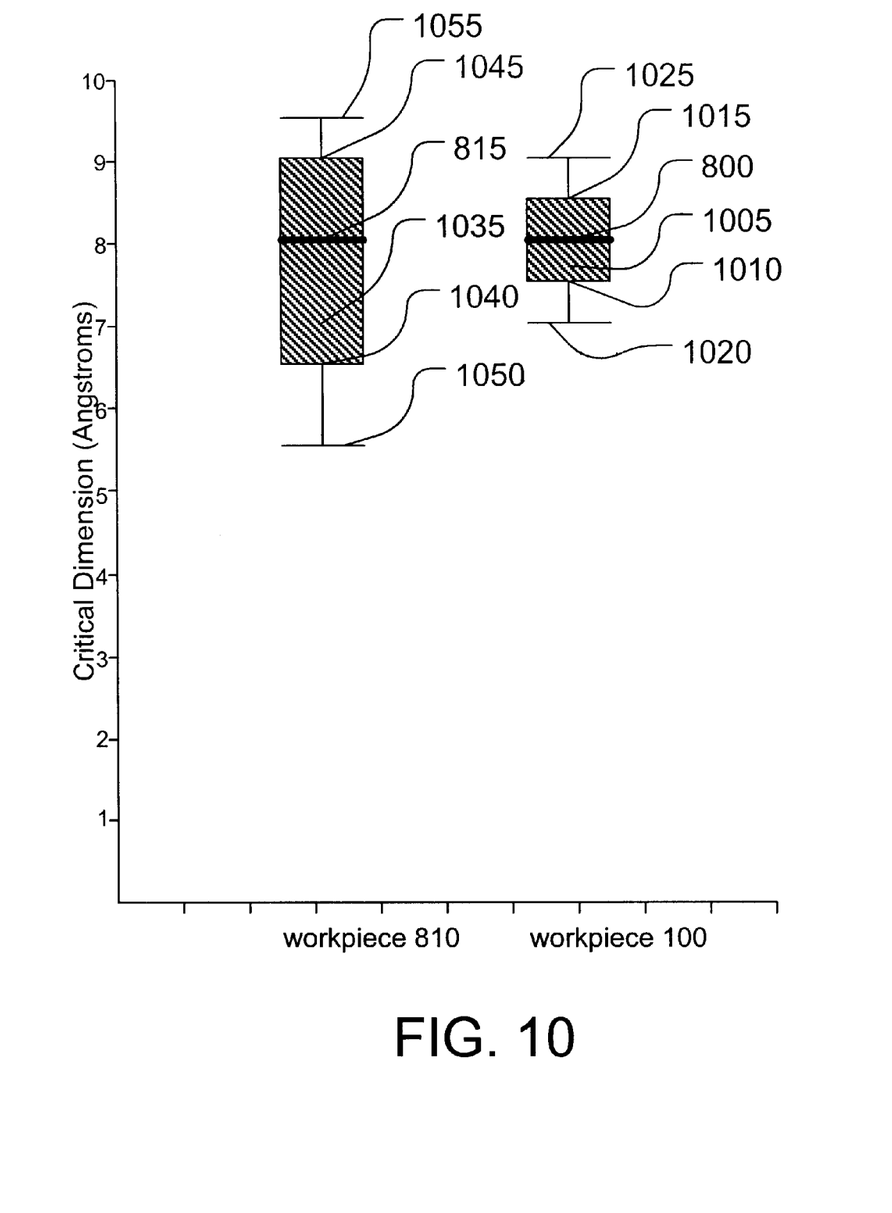

As shown in FIG. 1, in addition to, and/or instead of, the feedback control signal 135, the central values 145 may be sent from the CD central value display step 130 to a CD spread display step 150. In the CD spread display step 150, the central values 145 may be displayed. For example, as shown in FIG. 10, using a Tukey "box and whiskers" plot, the CD measurements performed on the features 205 of the test structure 200 of the workpiece 100 may have the median value 800 (see FIG. 8) contained within an interquartile range (IQR) box 1005 bounded by first and third quartile values 1010 and 1015, respectively. Whiskers 1020 and 1025 may not extend beyond one and a half times the difference between the third and first quartiles 1015 and 1010 (1.5×IQR).

The first quartile value 1010 is the median value of the CD measurements that are less than or equal to the median value 800. The third quartile value 1015 is the median value of the CD measurements that are greater than or equal to the median value 800. The IQR is the difference between the third and first quartiles 1015 and 1010. Any CD measurement values beyond the whiskers 1020 and 1025 are "outliers" and may not always be depicted in a Tukey box and whiskers plot.

As shown in FIG. 10, Tukey box and whiskers plots may be used to compare the CD measurement values taken using the test structure 200 formed on the workpiece 100 with the CD measurement values taken using the test structure 805 (not shown) formed on a workpiece 810 (not shown), for example. The CD measurements performed on the features 820 (not shown) of the test structure 805 of the workpiece 810 may have the median value 815 (see FIG. 8) contained within an IQR box 1035 bounded by first and third quartile values 1040 and 1045, respectively. Whiskers 1050 and 1055 may not extend beyond one and a half times the difference between the third and first quartiles 1045 and 1040 (1.5×IQR).

The first quartile value 1040 is the median value of the CD measurements that are less than or equal to the median value 815. The third quartile value 1045 is the median value of the CD measurements that are greater than or equal to the median value 815. The IQR is the difference between the third and first quartile values 1045 and 1040. Any CD measurement values beyond the whiskers 1050 and 1055 are "outliers" and may not always be depicted in a Tukey box and whiskers plot.

Figure 11:
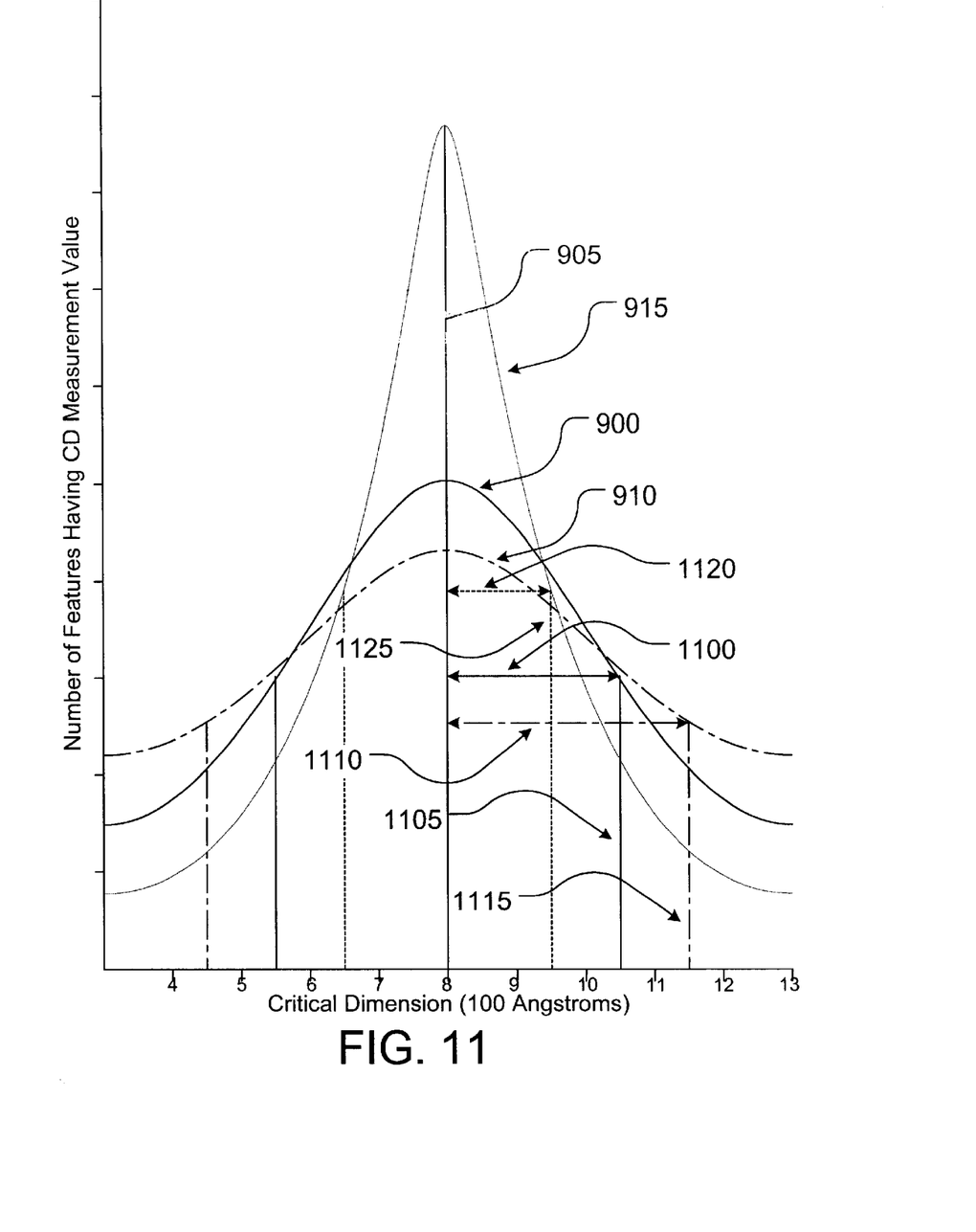

Alternatively, as shown in FIG. 11, using the Student's t-distribution plot 900, the CD measurements performed on the features 205 of the test structure 200 on the workpiece 100 may have the sample mean value 905 and a sample standard error 1100, bounded by the sample mean value 905 and a first standard error line 1105. The sample standard error 1100 is $$SE(\bar{x}) = \frac{s}{\sqrt{m}} = \sqrt{\frac{1}{m(m-1)} \sum_{i=1}^{m} (x_i - \bar{x})^2},$$

where the sample standard deviation is $$s = \sqrt{\frac{1}{(m-1)} \sum_{i=1}^{m} (x_i - \bar{x})^2}$$

for the CD measurements taken over all m of the features 205 that are measured on the test structure 200, where $x_i$ is the CD measurement of the ith feature 205. Note that the number m of the features 205 that are measured on the test structure 200 may be less than or equal to the total number M of the features 205 on the test structure 200. The sample standard error 1100 for the CD measurements decreases as the number m (the number of the features 205 on the test structure 200 that are measured) increases.

As shown in FIG. 11, Student's t-distribution plots 900 and 910 may be used to compare the CD measurement values taken using the test structure 200 formed on the workpiece 100 with the CD measurement values taken using the test structure 805 (not shown) formed on a workpiece 810 (not shown), for example. The CD measurements performed on the features 820 (not shown) of the test structure 805 of the workpiece 810 may have the sample mean value 905 and a sample standard error 1110, bounded by the sample mean value 905 and a first standard error line 1115. The sample standard error 1110 is $$SE(\bar{y}) = \frac{s}{\sqrt{n}} = \sqrt{\frac{1}{n(n-1)} \sum_{j=1}^{n} (y_j - \bar{y})^2},$$

where $$s = \sqrt{\frac{1}{(n-1)}\sum_{j=1}^{n}(y_j - \bar{y})^2}$$

for the CD measurements taken over all n of the features 820 that are measured on the test structure 805, where $y_j$ is the CD measurement of the jth feature 820. Note that the number n of the features 820 that are measured on the test structure 805 may be less than or equal to the total number T of the features 820 on the test structure 805. The sample standard error 1110 for the CD measurements decreases as the number n (the number of the features 820 on the test structure 805 that are measured) increases.

As shown in FIG. 11, the Student's t-distribution plots 900 and 910 may approach the Gaussian normal z-distribution plot 915 as the number of features n and m becomes very large, for m>n>> about 25. The Gaussian normal z-distribution plot 915 has a standard deviation 1120 ($\sigma/\sqrt{m}$), bounded by the mean value 905 ($\mu$) and a first standard deviation line 1125. The Gaussian normal standard deviation 1120 ($\sigma/\sqrt{m}$) is given by the expression $$\frac{\sigma}{\sqrt{m}} = \left\langle\left(\sum_{i=1}^{m}\frac{x_i}{m} - \mu\right)^2\right\rangle^{\frac{1}{2}} =$$

$$\left\langle\sum_{i=1}^{m}\frac{(x_i - \mu)^2}{m^2}\right\rangle^{\frac{1}{2}} = \frac{1}{m}\left[\sum_{i=1}^{m}\langle(x_i - \mu)^2\rangle\right]^{\frac{1}{2}} = \frac{1}{m}\left[\sum_{i=1}^{m}\sigma^2\right]^{\frac{1}{2}} = \frac{\sigma\sqrt{m}}{m}$$

that is substantially equivalent to the normal standard deviation $\sigma/(\sqrt{n})$ given by $$\frac{\sigma}{\sqrt{n}} = \left\langle\left(\sum_{j=1}^{n}\frac{y_j}{n} - \mu\right)^2\right\rangle^{\frac{1}{2}} =$$

$$\left\langle\sum_{j=1}^{n}\frac{(y_j - \mu)^2}{n^2}\right\rangle^{\frac{1}{2}} = \frac{1}{n}\left[\sum_{j=1}^{n}\langle(y_j - \mu)^2\rangle\right]^{\frac{1}{2}} = \frac{1}{n}\left[\sum_{j=1}^{n}\sigma^2\right]^{\frac{1}{2}} = \frac{\sigma\sqrt{n}}{n}$$

the limit m>n>> about 25, where $x_i$ (the CD measurement of the ith feature 205) and $y_j$ (the CD measurement of the jth feature 820) are treated as independent random variables with means $\langle x_i\rangle = \mu = \langle y_j\rangle$ and with variances $\langle(x_i-\mu)^2\rangle = \sigma^2 = \langle(y_j-\mu)^2\rangle$ for $1 \leq i \leq m$ and $1 \leq j \leq n$, and where the standard deviation 1120 ($\sigma/\sqrt{m}$) may be approximately 150 Å and may also be substantially equivalent to the normal standard deviation $\sigma/(\sqrt{n})$. Note that the independence means that $$\left\langle\left(\sum_{i=1}^{m}\frac{x_i}{m} - \mu\right)^2\right\rangle = \left\langle\sum_{i=1}^{m}\frac{(x_i - \mu)^2}{m^2}\right\rangle + 2\left\langle\sum_{j<i}\sum_{i=1}^{m}\frac{(x_i - \mu)(x_j - \mu)}{m^2}\right\rangle$$

and that $$\left\langle\sum_{j<i}\sum_{i=1}^{m}\frac{(x_i - \mu)(x_j - \mu)}{m^2}\right\rangle =$$

$$\sum_{j<i}\sum_{i=1}^{m}\frac{\langle(x_i - \mu)(x_j - \mu)\rangle}{m^2} = \sum_{j<i}\sum_{i=1}^{m}\frac{\langle(x_i - \mu)\rangle\langle(x_j - \mu)\rangle}{m^2}$$

and that $$\sum_{j<i}\sum_{i=1}^{m}\frac{\langle(x_i - \mu)\rangle\langle(x_j - \mu)\rangle}{m^2} =$$

$$\sum_{j<i}\sum_{i=1}^{m}\frac{(\langle x_i\rangle - \langle\mu\rangle)(\langle x_j\rangle - \langle\mu\rangle)}{m^2} = \sum_{j<i}\sum_{i=1}^{m}\frac{(\mu - \mu)(\mu - \mu)}{m^2} = 0.$$

Similarly, note that $$\left\langle\left(\sum_{j=1}^{n}\frac{y_j}{n} - \mu\right)^2\right\rangle = \left\langle\sum_{j=1}^{n}\frac{(y_j - \mu)^2}{n^2}\right\rangle + 2\left\langle\sum_{i<j}\sum_{j=1}^{n}\frac{(y_i - \mu)(y_j - \mu)}{n^2}\right\rangle$$

and that $$\left\langle\sum_{i<j}\sum_{j=1}^{n}\frac{(y_i - \mu)(y_j - \mu)}{n^2}\right\rangle =$$

$$\sum_{i<j}\sum_{j=1}^{n}\frac{\langle(y_i - \mu)(y_j - \mu)\rangle}{n^2} = \sum_{i<j}\sum_{j=1}^{n}\frac{\langle(y_i - \mu)\rangle\langle(y_j - \mu)\rangle}{n^2}$$

and that $$\sum_{i<j}\sum_{j=1}^{n}\frac{\langle(y_i - \mu)\rangle\langle(y_j - \mu)\rangle}{n^2} =$$

$$\sum_{i<j}\sum_{j=1}^{n}\frac{(\langle y_i\rangle - \langle\mu\rangle)(\langle y_j\rangle - \langle\mu\rangle)}{n^2} = \sum_{i<j}\sum_{j=1}^{n}\frac{(\mu - \mu)(\mu - \mu)}{n^2} = 0.$$

The display of the defect counts in the CD spread display step 150 may be used to alert an engineer of the need to adjust the processing performed in the processing step j 105. The engineer may also alter, for example, the type of spread to be displayed in the CD spread display step 150.

As shown in FIG. 1, a feedback control signal 155 may be sent from the CD spread display step 150 to the processing step j 105 to adjust the processing performed in the processing step j 105. In one illustrative embodiment, as shown in FIG. 10, the SEM may measure sample line width values $w_1, w_2, ..., w_m$, having the median value 815 of approximately 800 Å and an IQR of approximately 250 Å. In this illustrative embodiment, the line width w should have been approximately 750 Å, with a predetermined acceptable tolerance value for the line width w of approximately 50 Å and a predetermined acceptable tolerance value for the spread around the line width w of approximately 150 Å. In this illustrative embodiment, the tolerance value for the spread around the line width w (approximately 150 Å) is compared with the IQR of approximately 250 Å. Consequently, the feedback control signal 135 may act to cause the processing performed in the processing step j 105 to increase the poly overetch time, since the tolerance value for the spread around the line width w (approximately 150 Å) is exceeded by the IQR (approximately 250 Å).

In another illustrative embodiment, as shown in FIG. 10, the SEM may measure sample pitch values $p_1, p_2, ..., p_n$, having the median value 815 of approximately 800 Å and an IQR of approximately 250 Å. In this illustrative embodiment, the pitch p between the poly lines 210 should have been approximately 750 Å, with a predetermined acceptable tolerance value for the pitch p of approximately 50 Å and a predetermined acceptable tolerance value for the spread around the pitch p of approximately 150 Å. In this illustrative embodiment, the tolerance value for the spread around the pitch p (approximately 150 Å) is compared with the IQR of approximately 250 Å. Consequently, the feedback control signal 135 may act to cause the processing performed in the processing step j 105 to decrease the poly etch time, since the tolerance value for the spread around the pitch p (approximately 150 Å) is exceeded by the IQR (approximately 250 Å).

In yet another illustrative embodiment, as shown in FIG. 11, the SEM may measure sample line width values $w_1, w_2, \ldots, w_m$, having the sample mean value 905 of approximately 800 Å and a sample standard deviation 1110 of approximately 350 Å. In this illustrative embodiment, the line width w should have been approximately 750 Å, with a predetermined acceptable tolerance value for the line width w of approximately 50 Å and a predetermined acceptable tolerance value for the spread around the line width w of approximately 300 Å. In this illustrative embodiment, the tolerance value for the spread around the line width w (approximately 300 Å) is compared with the sample standard deviation 1110 of approximately 350 Å. Consequently, the feedback control signal 135 may act to cause the processing performed in the processing step j 105 to increase the poly overetch time, since the tolerance value for the spread around the line width w (approximately 300 Å) is exceeded by the sample standard deviation 1110 (approximately 350 Å).

In still yet another illustrative embodiment, as shown in FIG. 9, the SEM may measure sample pitch values $p_1, p_2, \ldots, p_n$, having a sample mean value 905 of approximately 800 Å and a sample standard deviation 1110 of approximately 350 Å. In this illustrative embodiment, the pitch p should have been approximately 750 Å, with a predetermined acceptable tolerance value for the pitch p of approximately 50 Å and a predetermined acceptable tolerance value for the spread around the pitch p of approximately 300 Å. In this illustrative embodiment, the tolerance value for the spread around the pitch p (approximately 300 Å) is compared with the sample standard deviation 1110 of approximately 350 Å. In this illustrative embodiment, the tolerance value (approximately 25 Å) is compared with the difference value (approximately 50 Å) between the desired CD value of approximately 750 Å and the sample mean value 905 of approximately 800 Å. Consequently, the feedback control signal 135 may act to cause the processing performed in the processing step j 105 to decrease the poly etch time, since the tolerance value for the spread around the pitch p (approximately 300 Å) is exceeded by the sample standard deviation 1110 (approximately 350 Å).

In one illustrative embodiment, in both the CD central value and the CD spread display steps 130 and 150, the engineer may be provided with advanced process data monitoring capabilities, such as the ability to provide historical parametric data in a user-friendly format, as well as event logging, real-time graphical display of both current processing parameters and the processing parameters of the entire run, and remote, i.e., local site and worldwide, monitoring. These capabilities may engender more optimal control of critical processing parameters, such as throughput accuracy, stability and repeatability, processing temperatures, mechanical tool parameters, and the like. This more optimal control of critical processing parameters reduces this variability. This reduction in variability manifests itself as fewer within-run disparities, fewer run-to-run disparities and fewer tool-to-tool disparities. This reduction in the number of these disparities that can propagate means fewer deviations in product quality and performance. In such an illustrative embodiment of a method of manufacturing according to the present invention, a monitoring and diagnostics system may be provided that monitors this variability and optimizes control of critical parameters.

Any of the above-disclosed embodiments of a method of manufacturing according to the present invention enables the use of central values and spreads of CD measurements sent from a measuring tool to make real-time processing tool adjustments, either manually and/or automatically, to improve and/or better control the yield. Additionally, any of the above-disclosed embodiments of a method of manufacturing according to the present invention enables semiconductor device fabrication with increased device density and precision, increased efficiency and increased signal-to-noise ratio for the metrology tools, enabling a streamlined and simplified process flow, thereby decreasing the complexity and lowering the costs of the manufacturing process and increasing throughput.

Moreover, any of the above-disclosed embodiments of a method of manufacturing according to the present invention enables CD measurements of a test structure (such as the test structure 200 as shown in FIG. 2) to be taken in a single scan. Subsequent determination of central values and spreads around the central values reduces the noise associated with poly line non-uniformities (such as grain structure in the poly line) as well as random variations in the metrology associated with where the poly line edge is determined.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of manufacturing, the method comprising:
   processing a work piece in a processing step;
   measuring dimensions of a repetitive critical dimension feature of a test structure formed on the work piece to form a set of critical dimension measurements;
   forming an output signal corresponding to a statistical analysis of the set of critical dimension measurements; and
   feeding back a control signal based on the output signal to adjust the processing performed in the processing step if the output signal corresponding to the set of critical dimension measurements indicates a predetermined tolerance value has been exceeded.

2. The method of claim 1, wherein the measuring to form a set of critical dimension measurements includes measuring line widths of lines, wherein each of the lines is formed to have a line width representative of a gate line of a transistor.

3. The method of claim 1, wherein the measuring to form a set of critical dimension measurements includes measuring pitches between lines, wherein each adjacent pair of the lines is formed to have a pitch representative of spacing between adjacent lines of a transistor array.

4. The method of claim 1, wherein the measuring to form a set of critical dimension measurements includes measuring line widths of lines and pitches between the lines, wherein each of the lines is formed to have a line width representative of a line width of a gate line of a transistor and each adjacent pair of the lines is formed to have a pitch representative of spacing between adjacent lines of a transistor array.

5. The method of claim 1, wherein the measuring to form a set of critical dimension measurements includes using a scanning electron microscope.

6. The method of claim 5, wherein the measuring to form a set of critical dimension measurements includes measuring a dimension of every one of a plurality of repetitive critical dimension features of the test structure on the work piece.

7. The method of claim 1, wherein the forming an output signal corresponding to a statistical analysis of the set of critical dimension measurements includes forming a median value of the set of critical dimension measurements.

8. The method of claim 7, wherein the forming an output signal corresponding to a statistical analysis of the set of critical dimension measurements includes forming first and third quartile values, and an interquartile range of the set of critical dimension measurements.

9. The method of claim 1, wherein the forming the output signal corresponding to a statistical analysis of the set of critical dimension measurements includes forming a mean value of the set of critical dimension measurements.

10. The method of claim 9, wherein the forming the output signal corresponding to a statistical analysis of the set of critical dimension measurements includes forming a standard deviation value of the critical dimension measurements.

11. A method of manufacturing, the method comprising:
processing a work piece in a processing step, the processing step including forming a test structure on the work piece, the test structure including a repetitive feature representative of a critical dimension;
measuring dimensions of the repetitive feature to form a set of critical dimension measurements;
forming an output signal corresponding to a statistical analysis of the set of critical dimension measurements;
feeding back a control signal based on the output signal to adjust the processing performed in the processing step if the output signal corresponding to the statistical analysis of the set of critical dimension measurements indicates a predetermined tolerance value has been exceeded.

12. The method of claim 11, wherein the measuring to form a set of critical dimension measurements includes measuring line widths of lines, wherein each of the lines is formed to have a line width representative of a gate line width of a transistor.

13. The method of claim 11, wherein the measuring to form a set of critical dimension measurements includes measuring pitches between lines, wherein each adjacent pair of the lines is formed to have a pitch representative of the spacing between adjacent lines of a transistor array.

14. The method of claim 11, wherein the forming the output signal corresponding to a statistical analysis of the set of critical dimension measurements includes forming a median value, first and third quartile values, and an interquartile range of the set of critical dimension measurements.

15. The method of claim 11, wherein the forming the output signal corresponding to a statistical analysis of the set of critical dimension measurements includes forming a mean value and a standard deviation value of the set of critical dimension measurements.

16. A method of manufacturing, the method comprising:
processing a workpiece in a processing step, the processing step including forming a test structure on the workpiece, the test structure including a plurality of lines, each of the lines formed to have a line width of a gate line of a transistor, and each of adjacent pairs of the lines formed to have a pitch between adjacent lines of a transistor array;
measuring line widths of at least two of the plurality of the lines of the test structure;
measuring pitches between at least two of the adjacent pairs of the lines of the test structure;
forming an output signal corresponding to a statistical analysis of the line widths and pitches measurements; and
feeding back a control signal based on the output signal to adjust the processing performed in the processing step if the output signal corresponding to the line widths and pitches measurements indicates a predetermined tolerance value has been exceeded.

17. The method of claim 16, wherein forming the output signal corresponding to a statistical analysis of the line widths and pitches measurements includes forming median values of the line widths and pitches measurements.

18. The method of claim 17, wherein forming the output signal corresponding to a statistical analysis of the line widths and pitches measurements includes forming first and third quartile values, and interquartile ranges of the line widths and pitches measurements.

19. The method of claim 16, wherein forming the output signal corresponding to a statistical analysis of the line widths and pitches measurements includes forming mean values of the line widths and pitches measurements.

20. The method of claim 19, wherein forming the output signal corresponding to a statistical analysis of the line widths and pitches measurements includes forming standard deviation values of the line widths and pitches measurements.

* * * * *